(12) United States Patent
Cusin et al.

(10) Patent No.: US 12,037,695 B2
(45) Date of Patent: Jul. 16, 2024

(54) METHOD FOR MANUFACTURING A HOROLOGICAL COMPONENT AND COMPONENT PRODUCED ACCORDING TO SAID METHOD

(71) Applicant: Nivarox-FAR S.A., Le Locle (CH)

(72) Inventors: Pierre Cusin, Villars-Burquin (CH); Alex Gandelhman, Colombier (CH); Michel Musy, Orpund (CH); Clare Golfier, La Neuveville (CH)

(73) Assignee: Nivarox-FAR S.A., Le Locle (CH)

( * ) Notice: Subject to any disclaimer, the term of this patent is extended or adjusted under 35 U.S.C. 154(b) by 785 days.

(21) Appl. No.: 17/120,799

(22) Filed: Dec. 14, 2020

(65) Prior Publication Data

US 2021/0189579 A1    Jun. 24, 2021

(30) Foreign Application Priority Data

Dec. 18, 2019   (EP) ..................................... 19217374

(51) Int. Cl.
*C25D 1/00*     (2006.01)
*G03F 7/00*     (2006.01)
*G03F 7/16*     (2006.01)

(52) U.S. Cl.
CPC ........... *C25D 1/003* (2013.01); *G03F 7/0002* (2013.01); *G03F 7/0035* (2013.01); *G03F 7/164* (2013.01); *G03F 7/168* (2013.01)

(58) Field of Classification Search
None
See application file for complete search history.

(56) References Cited

U.S. PATENT DOCUMENTS

| | | | |
|---|---|---|---|
| 2005/0263915 | A1 | 12/2005 | Fujita et al. |
| 2010/0159405 | A1 | 6/2010 | Ishikura et al. |
| 2017/0343900 | A1 | 11/2017 | Nees et al. |

FOREIGN PATENT DOCUMENTS

| | | |
|---|---|---|
| CH | 713 970 A1 | 1/2019 |
| CN | 101390022 A | 3/2009 |
| CN | 101861281 A | 10/2010 |
| CN | 101918617 A | 12/2010 |
| CN | 102459713 A | 5/2012 |
| CN | 105665925 A | 6/2016 |
| CN | 112987491 A | 6/2021 |
| CN | 113009780 A | 6/2021 |
| EP | 1 462 859 A2 | 9/2004 |
| EP | 2 157 476 A1 | 2/2010 |
| EP | 3 266 905 A1 | 1/2018 |
| JP | 2006-161138 A | 6/2006 |
| JP | 2009-80914 A | 4/2009 |

(Continued)

OTHER PUBLICATIONS

English translation JP 2016176090 (Year: 2016).*
English translation JP 2006161138 (Year: 2006).*

(Continued)

*Primary Examiner* — Stefanie S Wittenberg
(74) *Attorney, Agent, or Firm* — Oblon, McClelland, Maier & Neustadt, L.L.P.

(57) ABSTRACT

A method for manufacturing metal horological components, includes the steps of forming a multilevel mould made of a photosensitive resin, with a UV-LIGA method, and galvanically depositing a layer of at least one metal starting from a conductive layer in order to form a block that substantially reaches the upper surface of the photosensitive resin.

9 Claims, 1 Drawing Sheet

(56) References Cited

FOREIGN PATENT DOCUMENTS

| JP | 2011-51328 A | 3/2011 |
|----|----|----|
| JP | 2016-176090 A | 10/2016 |
| KR | 10-0974288 B1 | 8/2010 |
| TW | 200927640 A | 7/2009 |
| WO | WO 2013/182615 A1 | 12/2013 |
| WO | WO 2015/095291 A1 | 6/2015 |

OTHER PUBLICATIONS

English translation JP 2011051328 (Year: 2011).*
Notice of the Reason for Refusal issued Jan. 11, 2022 in Japanese Patent Application No. 2020-203200 (with English language translation), 6 pages.
Combined Taiwanese Office Action and Search Report issued Jul. 30, 2021 in Taiwanese Patent Application No. 109142394 (with English translation of Category of Cited Documents), 5 pages.
Office Action issued Jul. 30, 2021 in corresponding Taiwanese Patent Application No. 109142394 (English Translation only), 5 pages.
European Search Report issued Jun. 17, 2020 in European Application 19217374.8 filed Dec. 18, 2019 (with English Translation of Categories of Cited Documents), 3 pages.
Korean Office Action issued Aug. 16, 2022 in Korean Patent Application No. 10-2020-0176805 (with English translation), 10 pages.
Combined Chinese Office Action and Search Report issued Dec. 23, 2023, in corresponding Chinese Patent Application No. 202011509157.9 (with English Translation of Category of Cited Documents), 8 pages.

* cited by examiner

METHOD FOR MANUFACTURING A HOROLOGICAL COMPONENT AND COMPONENT PRODUCED ACCORDING TO SAID METHOD

CROSS-REFERENCE TO RELATED APPLICATION

This application claims priority to European Patent Application No. 19217374.8 filed on Dec. 18, 2019, the entire disclosure of which is hereby incorporated herein by reference.

FIELD OF THE INVENTION

The present invention relates to a method for manufacturing a complex multilevel metal structure by means of LIGA technology. The invention also concerns such a metal structure, in particular horological components, obtained by this method.

BACKGROUND OF THE INVENTION

Methods corresponding to the above definition are already known. In particular, the article by A. B. Frazier et al. entitled "Metallic Microstuctures Fabricated Using Photosensitive Polyimide Electroplating molds" and published in the Journal of Microelectromechanical systems (Vol. 2, N deg. 2, June 1993) describes a method for manufacturing multilevel metal structures by galvanic growth in polyimide moulds produced by photolithography of layers of photosensitive resin. That method comprises the following steps:
creating, on a substrate, a sacrificial metal layer and a priming layer for a subsequent step of galvanic growth,
spreading a layer of photosensitive polyimide,
irradiating the layer of polyimide with UV radiation through a mask corresponding to the contour of a level of the structure to be obtained,
developing the polyimide layer by dissolving the non-irradiated parts so as to obtain a polyimide mould,
filling the mould with nickel up to the height thereof by galvanic growth, and obtaining a substantially planar upper surface,
depositing a fine layer of chromium over the entire upper surface by evaporation under vacuum,
depositing, on the layer of chromium, a new layer of photosensitive resin,
irradiating the resin layer through a new mask corresponding to the contour of the level according to the structure to be obtained,
developing the polyimide layer so as to obtain a new mould,
filling the new mould with nickel up to the height thereof by galvanic growth,
separating the multilayer structure and the polyimide mould from the sacrificial layer and the substrate,
separating the multilayer structure from the polyimide mould.

It will be understood that the method which has just been described can, in principle be implemented iteratively in order to obtain metal structures having more than two layers.

Patent document WO2010/020515A1 describes the manufacture of a part with a plurality of layers by producing a complete photoresist mould corresponding to the final part to be obtained before the step of galvanic deposition of the metal of the part in the mould. Only multilevel parts for which the projections of the levels are included inside one another can be produced by this method.

A photoresist mould is likewise known from patent document EP2405301A1, comprising at least two levels, the levels formed in the substrate comprising only smooth vertical sides.

These methods only enable the manufacture of parts with basic geometries which are cylindrical, and does not enable the manufacture of parts comprising complex geometries such as bevels or chamfers.

SUMMARY OF THE INVENTION

The present invention aims to overcome the above-mentioned disadvantages as well as others, by providing a method enabling the manufacture of multilevel metal horological components, by combining a hot stamping step with LIGA technology in which a conductive layer is associated with a resin layer for each level in order to enable reliable galvanic growth in the case of multilevel components.

The present invention also aims to enable the manufacture of horological parts having complex geometries which are ordinarily infeasible using LIGA technology.

To this effect, the invention relates to a method for manufacturing at least one horological component, comprising the following steps:
 a) providing a substrate and applying a first layer of photosensitive resin;
 b) performing a hot stamping, using a stamp, of the first resin layer, by pressing the stamp up to a predefined distance from the substrate so as to keep a layer of resin, in order to shape the first resin layer and to define a first level of the horological component;
 c) irradiating the shaped first resin layer in order to define at least a first level of the component;
 d) applying a second layer of photosensitive resin covering the resultant structure from step c), then irradiating the second resin layer through a mask defining a second level of the component and dissolving the non-irradiated regions of the second photosensitive resin layer in order to form a mould comprising a first and a second level;
 e) depositing a conductive layer on the surfaces of the first and second resin layer;
 f) depositing a metal layer by electroforming in the mould, starting from the conductive layer, in order to form the component;
 g) successively removing the substrate, the resin and the conductive layer in order to release the component.

This method thus enables the production of multilevel parts on a single wafer.

According to other advantageous variants of the invention:
 step b) is carried out under vacuum.
 during step b), the first resin layer is heated to between 70° C. and 150° C.
 the stamp has an imprint in relief defining said at least first level of the component;
 the electrically conductive layer is implemented by global deposition on all the exposed surfaces;
 the electrically conductive layer is deposited by a physical vapour deposition, or printing with an ink or a conductive resin;
 said electrically conductive layer is Au, Ti, Pt, Ag, Cr or Pd, or a stack of at least two of these materials;
 the substrate is silicon;

the stamp is made of transparent material so as to irradiate the first resin layer through the stamp when the latter is pressed against the substrate;

the conductive layer has a thickness between 50 nm and 500 nm.

Finally, the invention relates to a horological component, obtained by a method according to the invention, such as pallets or an escapement wheel, for example.

It is thus understood that the method of the invention has a particularly advantageous application for the production of components for timepieces.

BRIEF DESCRIPTION OF THE DRAWINGS

Other features and advantages of the present invention will emerge more clearly from the detailed description which follows of an exemplary embodiment of a method according to the invention, this example being given purely by way of illustration and not being limiting, in combination with the attached drawing in which.

DETAILED DESCRIPTION OF A PREFERRED EMBODIMENT

Figure 1:
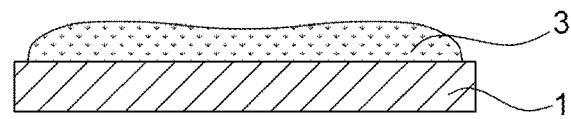
FIGS. 1 to 8 to illustrate the method steps according to an embodiment of the invention in view of the producing of a horological component.

The substrate) used in step a) of the method according to the invention is, for example, formed by a silicon substrate. During the first step a) of the method illustrated in FIG. 1, a layer of photosensitive resin is deposited on the substrate. The photosensitive resin 3 used in this method is preferably an octofunctional epoxy-based negative resin available under the reference SU-8 designed to polymerise under the action of UV radiation.

According to a particular embodiment of the invention, the resin is in the form of a dry film; the resin is therefore applied by lamination on the substrate 1.

Alternatively, the photosensitive resin could be a positive photoresist, which is designed to decompose under the action of UV radiation. It will be understood that the present invention is not limited to any particular type of photosensitive resin. A person skilled in the art would know to choose a photosensitive resin suitable for their needs from all the known resins which are suitable for UV photolithography.

The first resin layer 3 is deposited on the substrate 1 by any appropriate means, by centrifugal coating, spinning or even spraying to the desired thickness. Typically, the resin thickness is between 10 μm and 1000 μm, and preferably between 50 μm and 300 μm. Depending on the desired thickness and the deposition technique used, the resin layer 3 will be deposited in one or two steps.

The first resin layer 3 is then typically heated to between 90 and 120° C. for a duration depending on the deposited thickness in order to remove the solvent (pre-bake step). This heating dries and hardens the resin.

Figure 2:
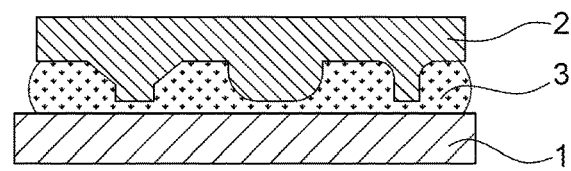

Subsequent step b) illustrated in FIG. 2 consists of performing a hot stamping of the first resin layer 3 in order to shape and define a first level of the horological component. The resin is first heated to a temperature between 70° C. and 150° C. at which it becomes viscous in order to enable its shaping by crushing it using a stamp 2 which presses it. This step is performed under vacuum in order to avoid the formation of air bubbles during the pressing of the resin layer 3. According to the invention, the stamp 2 is pressed to a predefined distance from the substrate 1 in such a way as to keep a layer of resin on the substrate 1.

Advantageously, the stamp 2 has an imprint in relief which can have variations in height and thus enabling at least a first level of the component to be defined, said at least first level thus has a complex three-dimensional geometry which is not possible to obtain by a conventional LIGA method.

It can also be considered to form two or more layers by means of the stamp in order to produce the complete geometry of the component to be obtained.

Figure 3:
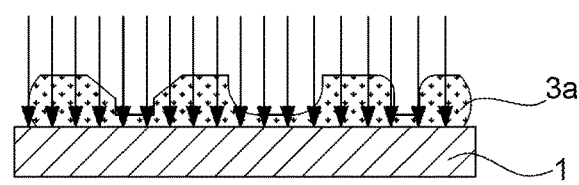

Subsequent step c) illustrated in FIG. 3 consists of irradiating the first resin layer 3 with UV radiation in order to define the first level of the component to be formed and thus to form a single photopolymerised region 3a.

According to an advantageous embodiment, the stamp 2 is made of a transparent material such as borosilicate glass. Such a stamp 2 made of transparent material makes it possible to irradiate the first resin layer 3 directly through the stamp 2 when the latter is pressed against the substrate 1, in contact with the resin layer, the irradiation of the resin layer being able to be performed hot or at ambient temperature.

An annealing step (post-bake step) of the first resin layer 3 may be necessary in order to complete the photopolymerisation induced by the UV radiation. This annealing step is preferably carried out between 90° C. and 95° C. The photopolymerised region 3a becomes insensitive to a large majority of solvents. By contrast, the photopolymerised regions can be subsequently dissolved by a solvent.

Figure 4:
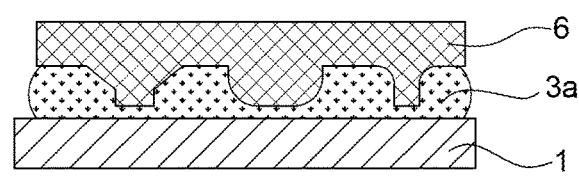
Figure 4A:
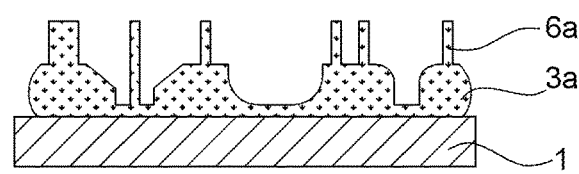

Subsequent step d) illustrated in FIG. 4 consists of depositing a second layer 6 of photosensitive resin covering the structure resulting from preceding step c). The same resin is used during this step, and the thickness can be greater than that deposited during step a). In general, the thickness varies as a function of the geometry of the component that it is desired to obtain.

The next step consists of irradiating the second resin layer 6 through a mask defining a second level of the component, and dissolving the non-irradiated regions of the second photosensitive resin layer 6. At the end of this step (FIG. 4), a mould is obtained comprising a first and a second level formed by the photopolymerised regions 3a and 6a.

The dissolving of the non-photopolymerised regions is performed using a suitable solvent, such as PGMEA (propylene glycol methyl ether acetate). A mould made of photopolymerised photosensitive resin 3a, 6a defining a first level and a second level of the component is thus obtained at the end of step d).

Figure 5:
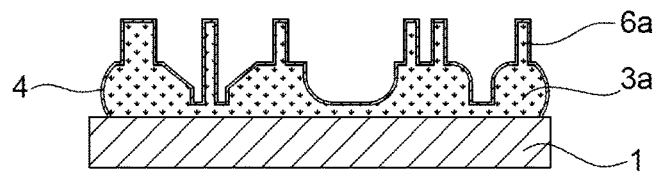

Step e) illustrated in FIG. 5 consists of depositing, for example by physical vapour deposition (PVD), a conductive layer 4, in other words a layer capable of starting a metal deposition by galvanic means. Typically the conductive layer 2 is Au, Ti, Pt, Ag, Cr or Pd, or a stack of at least two of these materials, and has a thickness between 50 nm and 500 nm. For example, the conductive layer 4 can be formed of a chromium or titanium sublayer covered with a layer of gold or copper. According to the invention, the electrically conductive layer 4 is implemented by global deposition on all the exposed surfaces, sides included.

A person skilled in the art could likewise consider implementing a 3D printing in order to deposit the conductive layer 4.

Figure 6:
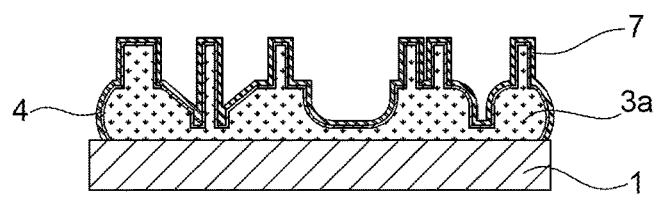

Subsequent step f) illustrated in FIG. 6 consists of depositing, in the formed mould, by electroforming or galvanic deposition, a layer 7 of a metal starting from the electrically conductive layer 2 until the desired thickness is obtained. In the case where a small thickness is required, the growth is relatively short, which allows hollow components to be obtained.

Metal in this context shall of course also include metal alloys. Typically, the metal will be chosen from the set comprising nickel, copper, gold or silver and, as alloys, gold-copper, nickel-cobalt, nickel-iron, nickel-phosphorus or nickel-tungsten. In general, the multilayer metal structure is made entirely of the same alloy or metal. However, it is also possible to change metal or alloy during the galvanic deposition step, so as to obtain a metal structure having at least two layers of different nature.

The electroforming conditions, in particular the composition of the baths, the geometry of the system, the voltages and the current densities, are chosen for each metal or alloy to be electrodeposited according to well-known techniques in the art of electroforming.

Figure 7:
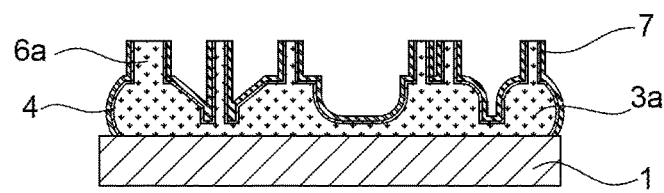

Step g) illustrated in FIG. 7 consists of machining the metal layer 7 by a mechanical method so as to adjust the height of the component and to separate the different parts if necessary (since galvanic growth starts everywhere, all the parts located on the same support are connected to one another).

Figure 8:
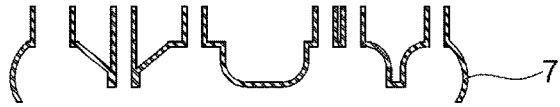

The last step illustrated in FIG. 8 consists of releasing the component by removing, by means of a succession of wet or dry etching steps, the substrate, the conductive layers or the resin layers, operations familiar to a person skilled in the art. For example the conductive layer 4 and the substrate 1 are removed by means of wet etching, which allows the component to be released from the substrate 1 without damaging it. In particular, the substrate made of silicon can be etched using a potassium hydroxide solution (KOH).

At the end of this first sequence, a component caught in the resin layers is obtained. A second sequence consists of removing the first layer 3 and the second layer 6 of resin by $O_2$ plasma etching, interspersed with wet etching of the intermediate metal layers.

At the end of this step, the components obtained can be cleaned, and possibly taken on a machine-tool in order to carry out machining or aesthetic finishing. At this stage, the parts can be directly used or even subjected to various decorative and/or functional treatments, typically physical or chemical depositions.

The method of the invention has particularly advantageous application for the manufacture of components for timepieces, such as springs, pallets, wheels, appliques, etc. Through this method, it is possible to produce components in very diverse shapes and having more complex geometries than those obtained via conventional photolithography operations. Such a method also makes it possible to obtain "shell" like components which are relatively light and robust, and which have good reliability in terms of geometries.

The invention claimed is:

1. A method for manufacturing at least one horological component, comprising:
   a) providing a substrate and applying a first resin layer of photosensitive resin on the substrate;
   b) performing a hot stamping, using a stamp, of the first resin layer, by pressing the stamp up to a predefined distance from the substrate so as to keep a layer of resin, in order to shape the first resin layer, the stamp being made of transparent material;
   c) irradiating the shaped first resin layer through the stamp while the stamp is pressed against the substrate and in contact with the first resin layer in order to define at least a first level of the component;
   d) applying a second layer of photosensitive resin covering a resultant structure from step c), then irradiating the second resin layer through a mask defining a second level of the component and dissolving non-irradiated regions of the second photosensitive resin layer in order to form a mould comprising a first level and a second level;
   e) depositing an electrically conductive layer on surfaces of the first resin layer and the second resin layer;
   f) depositing a metal layer by electroforming in the mould, starting from the electrically conductive layer, in order to form the component;
   g) machining the metal layer by a mechanical method, so as to adjust a height of the component, and releasing the component.

2. The method according to claim 1, wherein step b) is carried out under vacuum.

3. The method according to claim 1, wherein during step b), the first resin layer is heated to between 70° C. and 150° C.

4. The method according to claim 1, wherein the stamp has an imprint in relief in order to define said at least first level of the component.

5. The method according to claim 1, wherein during step e), the electrically conductive layer is implemented by global deposition on all exposed surfaces of the first resin layer and the second resin layer.

6. The method according to claim 1, wherein during step e), the electrically conductive layer is deposited by a physical vapour deposition, or printing with an ink or conductive resin.

7. The method according to claim 1, wherein said electrically conductive layer is Au, Ti, Pt, Ag, Cr or Pd.

8. The method according to claim 1, wherein the substrate is made of silicon.

9. The method according to claim 1, wherein the electrically conductive layer has a thickness of between 50 nm and 500 nm.

* * * * *